United States Patent
Sankaranarayanan et al.

(10) Patent No.: US 12,061,806 B2
(45) Date of Patent: Aug. 13, 2024

(54) SECOND READ INITIALIZATION ON LATCH-LIMITED MEMORY DEVICE

(71) Applicant: MICRON TECHNOLOGY, INC., Boise, ID (US)

(72) Inventors: Sundararajan Sankaranarayanan, Fremont, CA (US); Eric N. Lee, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 169 days.

(21) Appl. No.: 17/858,778

(22) Filed: Jul. 6, 2022

(65) Prior Publication Data

US 2023/0214139 A1    Jul. 6, 2023

Related U.S. Application Data

(60) Provisional application No. 63/295,209, filed on Dec. 30, 2021.

(51) Int. Cl.
*G06F 3/06* (2006.01)

(52) U.S. Cl.
CPC .......... *G06F 3/0632* (2013.01); *G06F 3/0604* (2013.01); *G06F 3/0656* (2013.01); *G06F 3/0659* (2013.01); *G06F 3/0679* (2013.01)

(58) Field of Classification Search
CPC ............ G11C 11/5621; G11C 11/5642; G11C 16/0483; G11C 16/08; G11C 16/26; G11C 16/32; G11C 2211/5642; G11C 8/08; G11C 8/18; G06F 3/0604; G06F 3/0632; G06F 3/0656; G06F 3/0659; G06F 3/0679
USPC ........................................... 711/103; 365/203
See application file for complete search history.

(56) References Cited

U.S. PATENT DOCUMENTS

| | | | |
|---|---|---|---|
| 10,120,604 B1* | 11/2018 | Srinivasan | G06F 12/0868 |
| 11,922,993 B2* | 3/2024 | Kawai | G11C 16/34 |
| 2019/0287629 A1* | 9/2019 | Bang | G06F 11/1068 |
| 2020/0350019 A1* | 11/2020 | Lee | G11C 16/10 |
| 2021/0005271 A1* | 1/2021 | Shin | G11C 11/5642 |
| 2022/0366961 A1* | 11/2022 | Kawai | G11C 11/4085 |

* cited by examiner

*Primary Examiner* — Ly D Pham
(74) *Attorney, Agent, or Firm* — Lowenstein Sandler LLP

(57) ABSTRACT

A second read command to read second data from an array of memory cells is detected. An initial voltage to be applied to at least one wordline coupled to at least a subset of the array of memory cells is caused prior to releasing a first data associated with a first read command stored in a page buffer. The initial voltage to increase to a target value is caused. The page buffer to sense the second data from a bitline coupled to a page of the subset of the array of memory cells is caused. The sensed second data out of the bitline into the page buffer is read responsive to determining that the first data has been released from the page buffer.

17 Claims, 6 Drawing Sheets

SECOND READ INITIALIZATION ON LATCH-LIMITED MEMORY DEVICE

RELATED APPLICATIONS

This application claims the benefit of U.S. Provisional Patent Application No. 63/295,209, filed Dec. 30, 2021, the entirety of which is incorporated herein by reference.

TECHNICAL FIELD

Embodiments of the disclosure generally relate to memory sub-systems, and more specifically, to second read initialization on a latch-limited memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments but are for explanation and understanding only.

DETAILED DESCRIPTION

Figure 1:
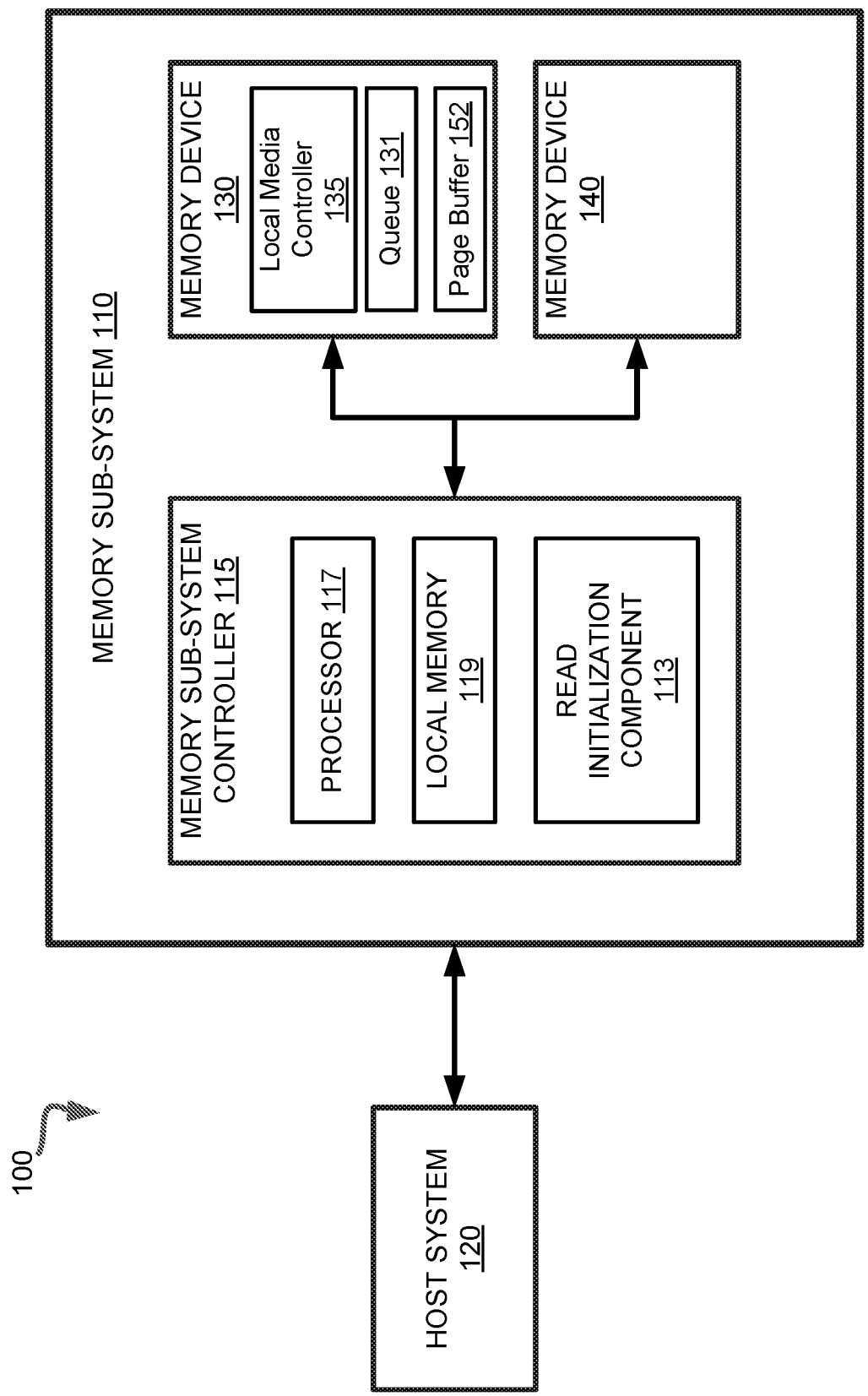
FIG. 1 illustrates an example computing system that includes a memory sub-system in accordance with some embodiments of the present disclosure.

Aspects of the present disclosure are directed to second read initialization on a latch-limited memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high-density non-volatile memory devices where retention of data is desired when no power is supplied to the memory device. One example of a non-volatile memory device is a negative-and (NAND) memory device. Other examples of non-volatile memory devices are described below in conjunction with FIG. 1. A non-volatile memory device is a package of one or more dies (or logical units (LUs) identified by logical numbers (LUNs)). Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device used with one or more bitlines to generate the address of each memory cell. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped to form a plane of the memory device to allow concurrent operations on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

In certain memory devices, a memory sub-system controller maintains a command queue. The command queue is filled with commands from a host system or generated locally by the memory sub-system controller is buffered and handled generally in a first-in-first-out order. The commands may include erase commands to erase physical blocks of memory. The commands may include write commands to program certain data to one or more dice (or planes) of a memory device (e.g., a page at a time). The commands may include read commands to read certain data out of the one or more dice (or planes) of the memory device (e.g., a page at a time). As a read command comes to the top of the command queue, it can be sent to a target die to read data from an address specified by the read command.

In various embodiments, as noted above, the command queue may include multiple read commands (e.g., a first read command followed by a second read command). When processing the first read command, a read voltage is applied to all the wordlines of the die to ramp up to an initial voltage. Once the voltage is applied to all wordlines of the die to ramp up to an initial voltage, a read voltage is applied to a selected wordline to move to a target value that sets up the wordline for read operations associated with the first read command. Next, a bitline coupled to a page (addressed in the read command) of an array of memory cells is pre-charged and the data stored in the page is sensed. The sensed data may then be read out into a latch or register of a page buffer. Depending on the embodiment, multiple read levels may be necessary to perform the read command. Thus, the above-described operations are repeated until the first read command is fully processed. Then, the wordlines and bitline are discharged of previously applied voltages to recover. In order to begin processing the second read command after the first read command, the data in the latch or register of the page buffer should be transferred out of the latch or register of the page buffer (e.g., transferred into the controller).

In some implementations, only one latch or register of the page buffer may be available for storing read data in certain memory devices. Accordingly, data stored in the latch of the page buffer (e.g., the data produced by the first read command) should be transferred to the controller before being overwritten by subsequent data (e.g., the data produced by the second read command). As a result, if a subsequent read command is next in the command queue for processing, the controller would be unable to process the subsequent read command until the latch of the page buffer becomes available (e.g., the previously stored data would be transferred to the controller). Accordingly, the performance of the memory device and quality-of-service (QoS) of host reads from the command queue are drastically affected.

Aspects of the present disclosure address the above and other deficiencies by initiating a new read command in a command queue (before completing a previous read command. In particular, before releasing the data produced by the previous read command to be read from a latch of a page buffer to a controller, processing of the subsequent read command can be initiated. Once the subsequent read command is initiated, a read voltage is applied to at least one wordline of a plane or die to ramp up to an initial voltage. Upon ramping up to the initial voltage, a read voltage is applied to a selected wordline to move the wordline to a target voltage. Once the target voltage is applied to the selected wordline, the page buffer may sense the data stored in the page addressed by the selected wordline. Prior to storing the sensed data produced by the subsequent read command to the latch of the page buffer, the controller can determine whether the latch of the page buffer has released the previously stored data produced by the previous read command.

Upon determining that the page buffer has not released the previously stored data produced by the previous read command, the controller can delay processing of the subsequent read command, in particular, storing in the latch of the page buffer the sensed data produced by the subsequent read command. The new data is not stored until the page buffer has released the previously stored data produced by the previous read command. Accordingly, once the page buffer has released the previously store data produced by the previous read command, the sensed data produced by the subsequent read command can be stored in the latch of the page buffer.

Advantages of the present disclosure include, but are not limited to, increasing read performance by parallelizing processing of a subsequent read command and a previous read command, thus improving the memory device and latch utilization.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a page buffer 152, which can include the circuitry used to program data to the memory cells of the memory device 130 and to read the data out of the memory cells. The memory device 130 can further include a queue 131 (e.g., a command queue) stored within a memory array of the memory device 130, such as within a die or a plane of the memory device 130. In alternative embodiments, queue 131 can be located on a local media buffer outside the memory array.

The memory sub-system 110 includes a read initialization component 113 that can initialize a new read command (e.g., a second read command) in a queue 131 of the non-volatile memory device (e.g., memory device 130) before the release of data stored in a latch of a page buffer 154 of the non-volatile memory device (e.g., memory device 130) produced by a previous read command (e.g., a first read command). In particular, controller 135 (e.g., local media controller 135) identifies a new read command in the queue 131 to be processed before data produced by the previous read command stored in the latch of the page buffer 154 is released to the controller. The controller 135 causes a voltage to be applied to all the wordlines of a plane or die to ramp up to an initial voltage. Controller 135 causes the voltage applied to a selected wordline to move to a target value from the initial voltage, which sets up the wordline for read operations. The controller 135 causes the unselected wordlines to continue increasing in voltage to turn on a NAND string if selected.

Controller 135 causes a page buffer to sense the data stored in the page addressed by the selected wordline. Upon sensing the data stored in the page, controller 135 determines whether the previously stored data produced by the previous read command stored in the latch of the page buffer 154 has been released to controller 135. Based on determining that the data produced by the previous read command stored in the latch of the page buffer 154 has not been released to controller 135, controller 135 delays the reading of the sensed data stored in the page to the latch of the page buffer 152. Once the data produced by the previous read command stored in the latch of the page buffer 154 has been released to controller 135, controller 135 may read the sensed data stored in the page into the latch of the page buffer 152. Depending on the embodiment, controller 135 causes the selected, and unselected wordlines and the bitlines produced by the previous read command to be discharged for purposes of recovery before another read command of the array can be processed (e.g., a third read command). In some embodiments, the data produced by the previous read command stored in the latch of the page buffer 154 is released to controller 135 before controller 135 senses the data stored in the page. Accordingly, controller 135 determines that the previously stored data produced by the previous read command stored in the latch of the page buffer 154 has been released to controller 135. The controller 135 reads the sensed data stored in the page into the latch of the page buffer 152. Depending on the embodiment, controller 135 causes the selected, and unselected wordlines and the bitlines produced by the previous read command to be discharged for purposes of recovery before another read command of the array can be processed (e.g., a third read command). Further details with regards to the operations of the read initialization component 113 are described below.

In some embodiments, the local media controller 135 includes at least a portion of the read initialization component 113. In some embodiments, the read initialization component 113 is part of the host system 110, an application, or an operating system. In other embodiments, the memory sub-system controller 115 includes at least a portion of read initialization component 113 configured to perform the functionality described herein.

Figure 2A:
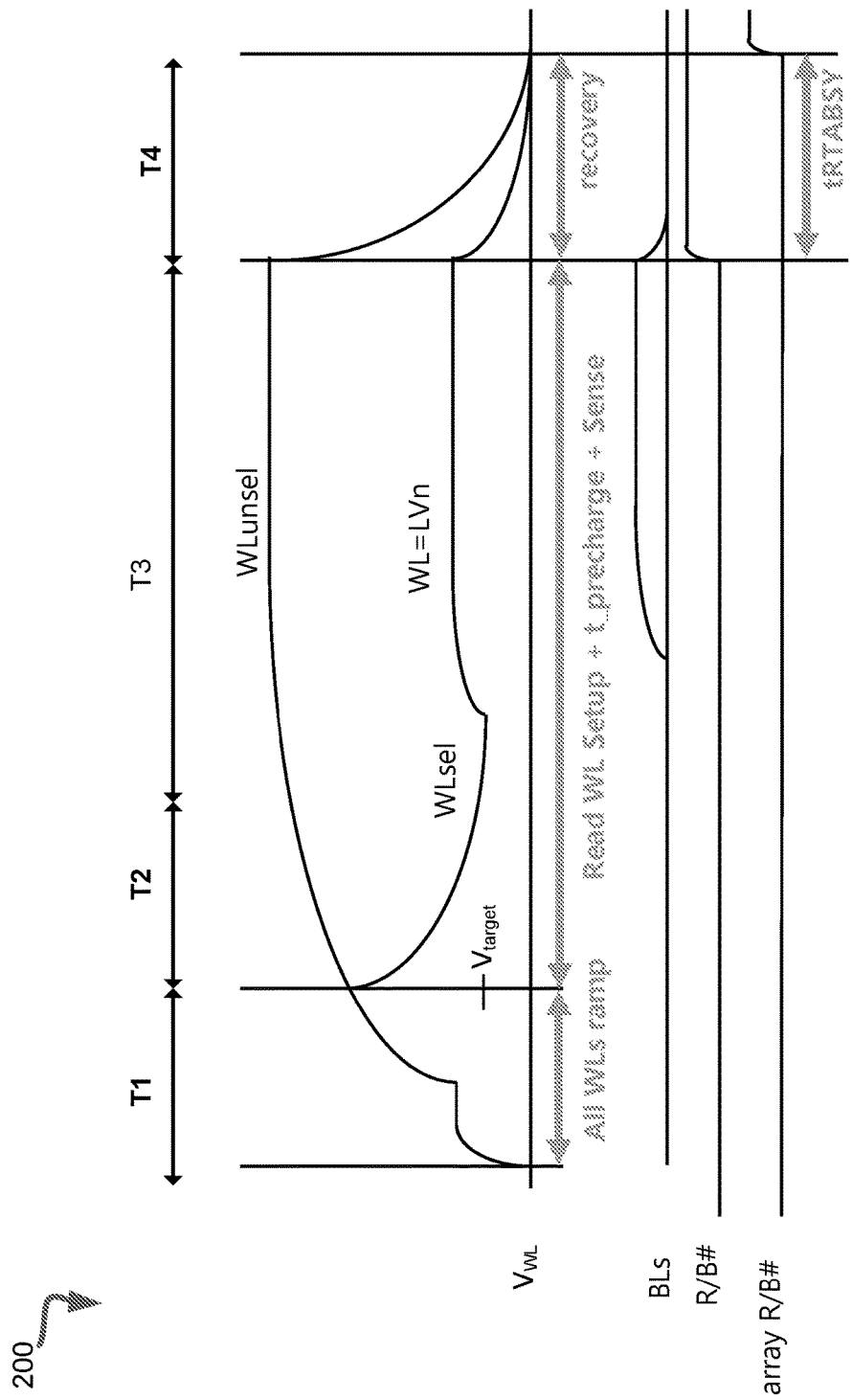
FIG. 2A illustrates a graph of voltage waveforms associated with a second read command in accordance with some embodiments of the present disclosure.

FIG. 2A illustrates a graph of voltage waveforms produced by a new read command according to an embodiment. Processing of a new read command is initiated during the processing of the previous read command. In particular, the new read command is initiated once a read port (array R/B #) of the array of memory cells (coupled to the wordlines and bitlines) indicates that data (e.g., produced by the previous read command) is ready to be read. Accordingly, during a first time period (T1) of processing the read command, control logic (e.g., of the local media controller 135) causes a voltage applied to all the wordlines of a plane or die to ramp up to an initial voltage. During a second time period (T2), the control logic causes the voltage applied to a selected wordline ($WL_{sel}$) to move to a target value ($V_{target}$) that sets up the wordline for read operations. Also, during the second time period (T2), the control logic causes unselected wordlines (WLunsel) to continue increasing in voltage to turn on a NAND string if selected. During the third time period (T3), the control logic causes a page buffer to sense the data stored in the page addressed by the selected wordline. Before reading the data out into a latch or register of the page buffer, the control logic determines whether the data previously stored in a latch or register of the page buffer (e.g., data produced by the previous read command) has been released from the data latch.

With continued reference to FIG. 2A, the control logic determines that the data previously stored in a latch or register of the page buffer (e.g., data produced by the previous read command) has been released from the data latch (e.g., at some point during the first time period (T1), the second time period (T2), or the third time period (T3) before the data previously stored in the latch or register of the page buffer has been released from the data latch). Accordingly, the data (e.g., data produced by the new read command) is read out into a latch or register of the page buffer. During a fourth time period (T4), the control logic causes the selected and unselected wordlines and the bitlines to discharge for purposes of recovery before another read command of the array can be processed. Also, during the fourth time period, a control signal (R/B #) identifying the wordline moves to a high value, indicating that the memory device is ready for a new command (as opposed to being busy). Further, during the fourth time period, a read port (array R/B #) of the array of memory cells (coupled to the wordlines and bitlines) is indicated as having data ready to be read before the next read command is started to be processed. In one embodiment, this read port is on the die currently being read.

Figure 2B:
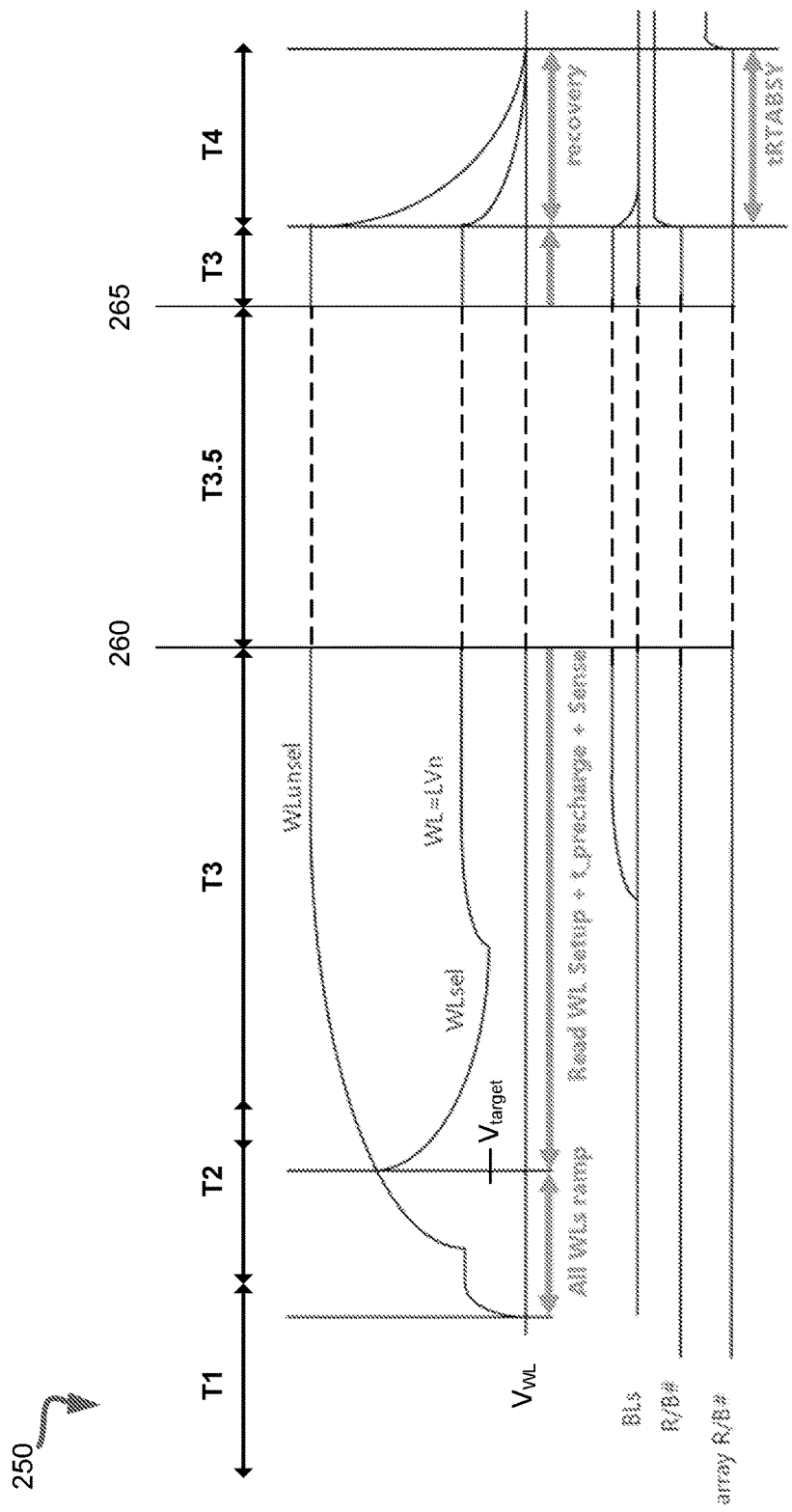
FIG. 2B illustrates a graph of voltage waveforms associated with a second read command in accordance with some embodiments of the present disclosure.

FIG. 2B illustrates a graph of voltage waveforms produced by a new read command according to an embodiment. Processing of a new read command is initiated during the processing of the previous read command, in particular, once a read port (array R/B #) of the array of memory cells (coupled to the wordlines and bitlines) indicates that data (e.g., produced by the previous read command) is ready to be read. Accordingly, during a first time period (T1) of processing the read command, control logic (e.g., of the local media controller 135) causes a voltage applied to all the wordlines of a plane or die to ramp up to an initial voltage. During a second time period (T2), the control logic causes the voltage applied to a selected wordline (WLsel) to move to a target value ($V_{target}$) that sets up the wordline for read operations. Also, during the second time period (T2), the control logic causes unselected wordlines (WLunsel) to continue increasing in voltage to turn on a NAND string if selected. During a third time period (T3), the control logic causes a page buffer to sense the data stored in the page addressed by the selected wordline. Before reading the data out into a latch or register of the page buffer, the control logic determines whether the data previously stored in a latch or register of the page buffer (e.g., data produced by the previous read command) has been released from the data latch.

With continued reference to FIG. 2B, the control logic, at a time point 260 during the third time period (T3), determines that the data previously stored in a latch or register of the page buffer (e.g., data produced by the previous read command) has not been released from the data latch (e.g., at some point during the first time period (T1), the second time period (T2), or the third time period (T3) before time point 260). Accordingly, the control logic delays reading out the data into the latch or register of the page buffer due to the latch or register containing data produced by the previous read command ready to be read out of the latch or register of the page buffer. The delay may be sustained for a period of time (T3.5) until a time point 265. The data previously stored in the latch or register of the page buffer (e.g., data produced by the previous read command) is released from the data latch. Once the control logic determines that the data previously stored in the latch or register of the page buffer (e.g., data produced by the previous read command) is released from the data latch, during the fourth period of time (T4), the data (e.g., data produced by the new read command) is read out into the latch or register of the page buffer.

Once the data is read into the latch or register of the page buffer, the control logic causes the selected and unselected wordlines and the bitlines to discharge for purposes of recovery before another read command of the array can be processed. Also, during the fourth time period (T4), a control signal (R/B #) identifying the wordline moves to a high value, indicating that the memory device is ready for a new command (as opposed to being busy). Further, during the fourth time period (T4), a read port (array R/B #) of the array of memory cells (coupled to the wordlines and bitlines) is indicated as having data ready to be read before the next read command is started to be processed. In one embodiment, this read port is on the die currently being read.

Figure 3:
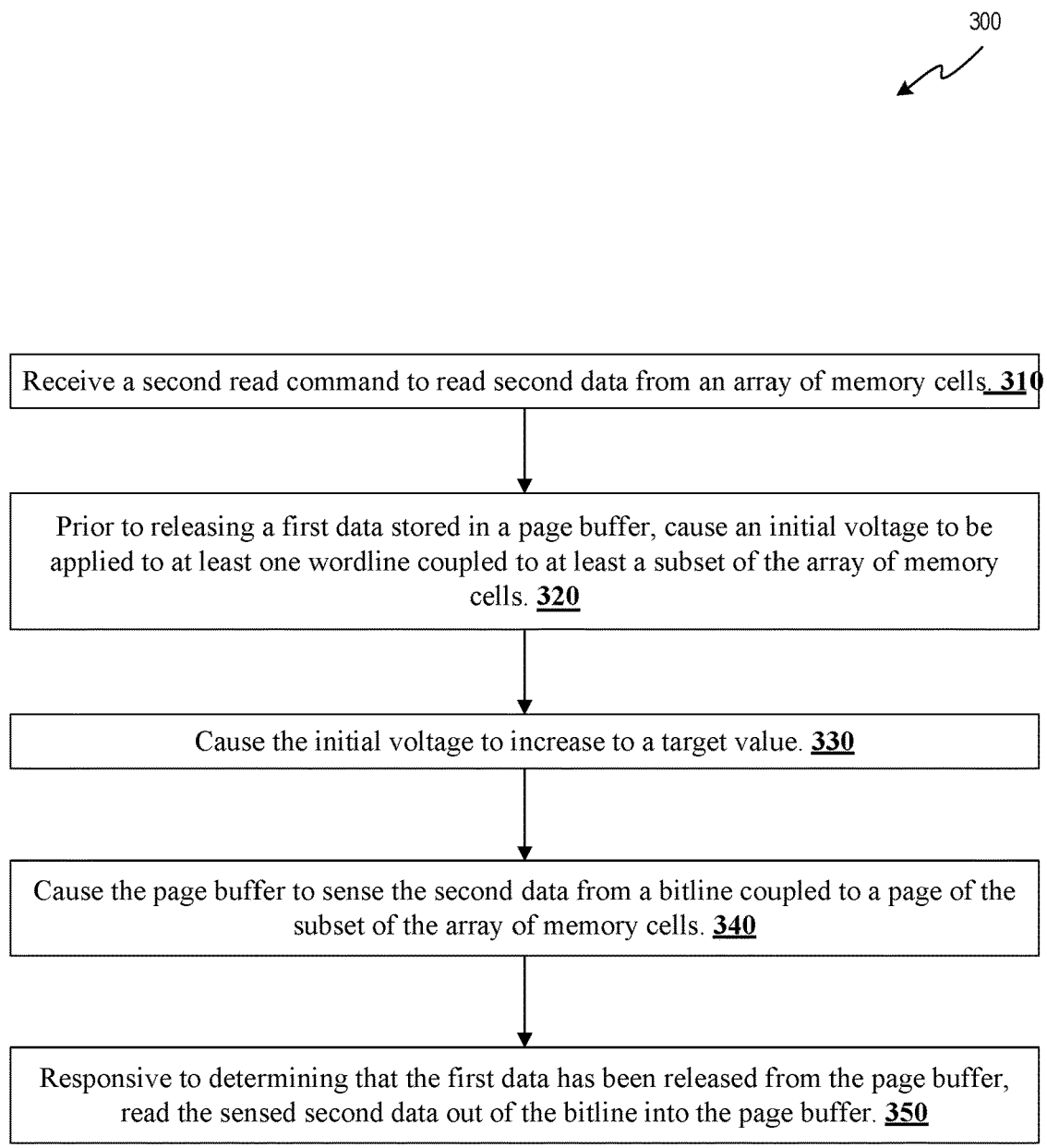
FIG. 3 is a flow diagram of an example method of initializing a second read on a latch-limited memory device in accordance with some embodiments of the present disclosure.

FIG. 3 is a flow diagram of an example method 300 to initialize a second read on a latch-limited memory device, in accordance with some embodiments of the present disclosure. Method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 300 is performed by the read initialization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic receives a second read command to read second data from the array of memory cells. As described previously, a memory device may include a page buffer to program data and read data to and/or out the memory cells of the memory device. The memory device further includes a queue storing the second read command.

At operation 320, prior to releasing a first data produced by a first read command stored in a page buffer, the processing logic causes an initial voltage to be applied to the at least one wordline. The first data is produced by a first read command that was received prior to the second read command. As described previously, prior to first data produced by the first read command stored in a latch of the page buffer is released, the processing logic applies a voltage to all the wordlines of a plane or die to ramp up to an initial voltage.

At operation 330, the processing logic causes the initial voltage applied to the at least one wordline to be increased to a target value. As described previously, the processing logic moves the voltage applied to a selected wordline to a target value from the initial voltage, which sets up the wordline for read operations.

At operation 340, the processing logic causes the page buffer to sense the second data from a bitline coupled to a page of the subset of the array of memory cells. As described previously, the processing logic causes the page buffer to sense the data stored in the page addressed by the selected wordline. At operation 350, responsive to determining that the first data has been released from the page buffer, the processing logic reads the sensed second data out of the bitline into the page buffer. As described previously, to determine that the first data has been released from the page buffer, the processing logic determines that the first data has been read out of the latch of the page buffer to a controller. Reading the sensed second data out of the bitline into the page buffer includes causing the processing logic to read the second data into a latch of the page buffer.

In some embodiments, responsive to determining that the first data has not been released from the page buffer, the processing logic delays reading the sensed second data out of the bitline into the page buffer. Delaying the reading of the sensed data stored in the page to the latch of the page buffer includes causing the processing logic to suspend the read operation to not read the sensed second data out of the bitline into the latch of the page buffer. Upon determining that the first data has subsequently been released from the page buffer, the processing logic suspends delay of reading the sensed second data out of the bitline into the page buffer to read the sensed second data out of the bitline into the page buffer. Accordingly, the processing logic reads the second data into a latch of the page buffer. Depending on the embodiment, responsive to determining that the second read command does not include additional voltage read levels, the processing logic causes the initial voltage applied to the wordline of the at least one wordline to be discharged.

Depending on the embodiments, responsive to determining that the second read command includes additional voltage read levels, for each additional voltage read level, the processing logic causes the initial voltage to increase to a target value produced by the respective voltage read level of the additional voltage read levels, causes the page buffer to sense the second data from a bitline coupled to a page of the subset of the array of memory cells and reads the sensed data into the latch of the page buffer. Upon performing the additional voltage read levels, the processing logic causes the initial voltage applied to the wordline of the at least one wordline to be discharged.

Figure 4:
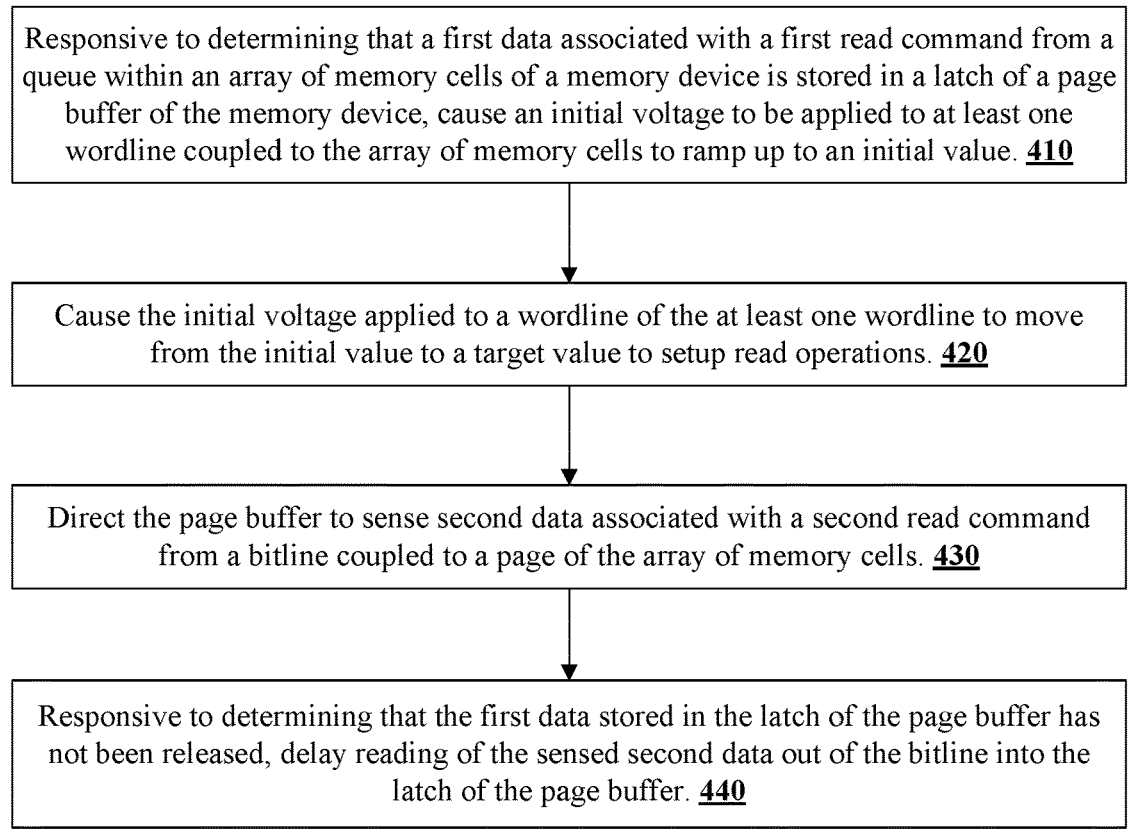
FIG. 4 is a flow diagram of an example method of initializing a second read on a latch-limited memory device in accordance with some embodiments of the present disclosure.

FIG. 4 is a flow diagram of an example method 400 to initialize a second read on a latch-limited memory device, in accordance with some embodiments of the present disclosure. Method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 400 is performed by the read initialization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, responsive to determining that a first data produced by a first read command from a queue within an array of memory cells of a memory device is stored in a latch of a page buffer of the memory device, the processing logic causes an initial voltage to be applied to at least one wordline coupled to the array of memory cells to ramp up to an initial value. As described previously, a memory device may include the page buffer to program data and read data to and/or out the memory cells of the memory device. The memory device further includes a queue storing the second read command. The processing logic causes the initial voltage to be applied to the at least one wordline coupled to the array of memory cells to process a second read command in the queue. At operation 420, the processing logic causes the initial voltage applied to a wordline of the at least one wordline to move from the initial value to a target value to set up read operations.

At operation 430, the processing logic directs the page buffer to sense second data produced by a second read command from a bitline coupled to a page of the array of memory cells. As described previously, the processing logic causes the page buffer to sense the data stored in the page addressed by the selected wordline. At operation 440, responsive to determining that the first data stored in the latch of the page buffer has not been released, the processing logic delays reading of the sensed second data out of the bitline into the latch of the page buffer. In some embodiments, the processing logic suspends the delay of reading the sensed second data out of the bitline into the latch of the page buffer, responsive to determining that the first data has been released from the page buffer. The processing logic determines that the first data stored in the latch of the page buffer has not been transferred from the latch of the memory device into a controller coupled to the memory device. Upon determining that the first data has been released from the page buffer, the processing logic reads the sensed second data out of the bitline into the latch of the page buffer. Once the data is read out of the bitline into the latch of the page buffer, the processing logic may cause the initial voltage applied to wordline of the at least one wordline to be discharged. Depending on the embodiment, if a subsequent read command is present in the queue, the processing logic may begin processing the subsequent read command before causing the initial voltage applied to wordline of the at least one wordline to be discharged Depending on the embodiment, responsive to determining that the second read command includes additional voltage read levels, for each additional voltage read level, the processing logic causes the initial voltage applied to the wordline of the at least one wordline to move from the initial value to a target value produced by a respective voltage read level of the additional voltage read levels, directs the page buffer to sense second data, and reads the sensed second data into the latch of the page buffer. Upon performing the additional voltage read levels, the processing logic causes the initial voltage applied to the wordline of the at least one wordline to be discharged. Depending on the embodiment, if a subsequent read command is present in the queue, the processing logic may begin processing the subsequent read command before causing the initial voltage applied to wordline of the at least one wordline to be discharged.

Figure 5:
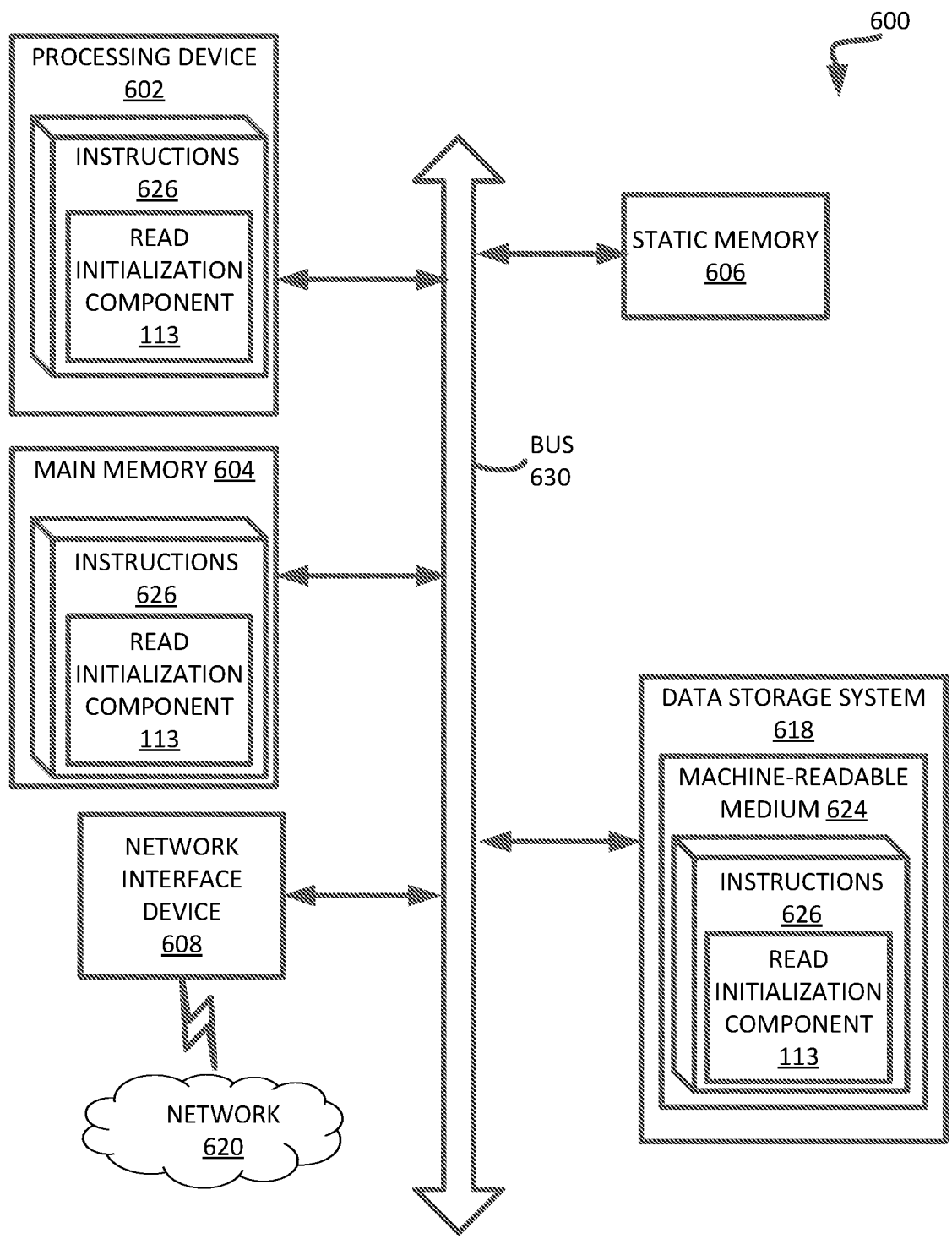
FIG. 5 is a block diagram of an example computer system in which embodiments of the present disclosure may operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read initialization component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a read initialization component (e.g., the read initialization component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be produced by the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
an array of memory cells comprising at least one wordline coupled to at least a subset of the array of memory cells; and
control logic coupled to the at least one wordline, the control logic to perform operations comprising:
receiving a second read command to read second data from the array of memory cells;
prior to releasing a first data stored in a page buffer, causing an initial voltage to be applied to the at least one wordline, wherein the first data is produced by a first read command that was received prior to the second read command;
causing the initial voltage applied to the at least one wordline to be increased to a target value;
causing the page buffer to sense the second data from a bitline coupled to a page of the subset of the array of memory cells; and
responsive to determining that the first data has not been released from the page buffer, delaying reading the sensed second data out of the bitline into the page buffer.

2. The device of claim 1, wherein the operations further comprise:
responsive to determining that the first data has been released from the page buffer, reading the sensed second data out of the bitline into the page buffer.

3. The device of claim 1, wherein the operations further comprise:
responsive to determining that the second read command includes additional voltage read levels, for each additional voltage read level, causing the initial voltage to increase to a target value associated with the respective voltage read level of the additional voltage read levels;
causing the page buffer to sense the second data; and
reading the sensed second data into the page buffer.

4. The device of claim 1, wherein the operations further comprise:
responsive to determining that the second read command does not include additional voltage read levels, causing the initial voltage applied to the wordline of the at least one wordline to be discharged.

5. The device of claim 1, wherein determining that the first data has been released from the page buffer includes determining that the first data has been read out of a latch of the page buffer.

6. The device of claim 1, wherein reading the sensed second data out of the bitline into the page buffer includes reading the second data into a latch of the page buffer.

7. A method comprising:
receiving a second read command to read second data from an array of memory cells;
prior to releasing a first data stored in a page buffer, causing an initial voltage to be applied to at least one wordline coupled to at least a subset of the array of memory cells, wherein the first data is produced by a first read command that was received prior to the second read command;
causing the initial voltage applied to the at least one wordline to be increased to a target value;
causing the page buffer to sense the second data from a bitline coupled to a page of the subset of the array of memory cells; and
responsive to determining that the first data has not been released from the page buffer, delaying reading the sensed second data out of the bitline into the page buffer.

8. The method of claim 7, further comprising:
responsive to determining that the first data has been released from the page buffer,
reading the sensed second data out of the bitline into the page buffer.

9. The method of claim 7, further comprising:
responsive to determining that the second read command includes additional voltage read levels, for each additional voltage read level, causing the initial voltage to increase to a target value associated with the respective voltage read level of the additional voltage read levels, causing the page buffer to sense the second data, and reading the sensed second data into the page buffer.

10. The method of claim 7, further comprising:
responsive to determining that the second read command does not include additional voltage read levels, causing the initial voltage applied to the wordline of the at least one wordline to be discharged.

11. The method of claim 7, wherein determining that the first data has been released from the page buffer includes determining that the first data has been read out of a latch of the page buffer.

12. The method of claim 7, wherein reading the sensed second data out of the bitline into the page buffer includes reading the second data into a latch of the page buffer.

13. A non-transitory computer-readable medium comprising instructions that, responsive to execution by a processing device, cause the processing device to perform operations comprising:
responsive to determining that a first data associated with a first read command from a queue within an array of memory cells of a memory device is stored in a latch of a page buffer of the memory device, causing an initial voltage to be applied to at least one wordline coupled to the array of memory cells to ramp up to an initial value;
causing the initial voltage applied to a wordline of the at least one wordline to move from the initial value to a target value to setup read operations;
directing the page buffer to sense second data associated with a second read command from a bitline coupled to a page of the array of memory cells; and
responsive to determining that the first data has been released from the page buffer, reading the sensed second data out of the bitline into the page buffer.

14. The non-transitory computer-readable medium of claim 13, wherein causing the processing device to further perform operations comprising:
causing the initial voltage applied to wordline of the at least one wordline to be discharged.

15. The non-transitory computer-readable medium of claim 13, wherein delaying reading of the sensed second data out of the bitline into the latch of the page buffer is suspended responsive to determining that the first data has been released from the page buffer.

16. The non-transitory computer-readable medium of claim 13, wherein causing the processing device to further perform operations comprising:
responsive to determining that the second read command includes additional voltage read levels, for each additional voltage read level, causing the initial voltage applied to the wordline of the at least one wordline to move from the initial value to a target value associated with a respective voltage read level of the additional voltage read levels, directing the page buffer to sense second data, and reading of the sensed second data into the latch of the page buffer.

17. The non-transitory computer-readable medium of claim 13, wherein determining that the first data stored in the latch of the page buffer has not been released includes determining that the first data stored in the latch of the page buffer has not been transferred from the latch of the memory device into a controller coupled to the memory device.

* * * * *